(12) United States Patent
Keith

(10) Patent No.: US 11,473,945 B2
(45) Date of Patent: Oct. 18, 2022

(54) MODULAR WIRELESS SENSING DEVICE

(71) Applicant: Brightsentinel Limited, Cambridge (GB)

(72) Inventor: Robert Leslie Keith, Cambridge (GB)

(73) Assignee: BRIGHTSENTINEL HOLDING LTD, Cambridge (GB)

( * ) Notice: Subject to any disclaimer, the term of this patent is extended or adjusted under 35 U.S.C. 154(b) by 0 days.

(21) Appl. No.: 16/118,138

(22) Filed: Aug. 30, 2018

(65) Prior Publication Data

US 2019/0137306 A1 May 9, 2019

Related U.S. Application Data

(63) Continuation-in-part of application No. 15/235,877, filed on Aug. 12, 2016, now Pat. No. 11,378,468.

(51) Int. Cl.
*G01K 1/10* (2006.01)
*G01D 11/24* (2006.01)
(Continued)

(52) U.S. Cl.
CPC ........... *G01D 11/245* (2013.01); *G01D 9/005* (2013.01); *G01D 21/00* (2013.01); *H05K 1/144* (2013.01);
(Continued)

(58) Field of Classification Search
CPC ...... G01D 11/245; G01D 9/005; G01D 21/00; H05K 1/144; H05K 1/181; H05K 7/1427; H05K 2201/041; H05K 2201/049; H05K 2201/10098; H05K 2201/10151; H05K 2201/10356; H05K 1/028; H05K 1/18;
(Continued)

(56) References Cited

U.S. PATENT DOCUMENTS 8,919,188 B2 * 12/2014 Li ........................... B60C 23/02
73/146
10,356,567 B2 * 7/2019 Shirazi .................. H04M 15/41
(Continued)

FOREIGN PATENT DOCUMENTS

CN 10565864 B * 11/2014
CN 206672162 U * 11/2017
(Continued)

*Primary Examiner* — Gail Kaplan Verbitsky
(74) *Attorney, Agent, or Firm* — Gibraltar Consulting LLC; Tariq S. Najee-Ullah

(57) ABSTRACT

The present disclosure provides a wireless sensing device. In an embodiment, the wireless sensing device includes (A) a button cell. The button cell has a positive electrode and a negative electrode. The device includes (B) a first printed circuit board (IPCB) located on a top surface of the button cell. The IPCB has a first contact and a second contact electrically connected to respective positive electrode and negative electrode of the button cell. The IPCB includes (i) a processor, and (ii) a wireless communication component (WCC). Each of the (i) processor, and (ii) WCC are electrically connected to the IPCB. The device includes (C) a sensor module. The sensor module includes a second PCB (2PCB) and one or more sensor chips electrically connected to the 2PCB. (D) The device has a length from 10 mm to 30 mm, a thickness from 3 mm to 10 mm and a width from 10 mm to 30 mm.

15 Claims, 5 Drawing Sheets

(51) Int. Cl.
 *H05K 1/18*  (2006.01)
 *H05K 1/14*  (2006.01)
 *H05K 7/14*  (2006.01)
 *G01D 21/00*  (2006.01)
 *G01D 9/00*  (2006.01)
 *G01K 1/16*  (2006.01)
 *G01K 7/00*  (2006.01)

(52) U.S. Cl.
 CPC ........... *H05K 1/181* (2013.01); *H05K 7/1427* (2013.01); *G01K 1/16* (2013.01); *G01K 7/00* (2013.01); *H05K 2201/041* (2013.01); *H05K 2201/049* (2013.01); *H05K 2201/10098* (2013.01); *H05K 2201/10151* (2013.01); *H05K 2201/10356* (2013.01)

(58) Field of Classification Search
 CPC ............ H05K 2201/10083; H05K 1/00; G01L 17/00; G01K 7/00; G01K 1/16
 USPC ........................................ 374/178, 170, 208
 See application file for complete search history.

(56) References Cited

U.S. PATENT DOCUMENTS

| | | | |
|---|---|---|---|
| 11,206,499 B2* | 12/2021 | Shenoy | H04R 25/554 |
| 2010/0200291 A1* | 8/2010 | Patel | E21B 43/08 |
| | | | 174/70 R |
| 2014/0299783 A1* | 10/2014 | Valentino | G01J 1/0488 |
| | | | 250/394 |
| 2015/0044976 A1* | 2/2015 | Baek | H05K 3/284 |
| | | | 29/601 |
| 2016/0109967 A1* | 4/2016 | Craig | G06F 3/03545 |
| | | | 345/179 |
| 2020/0047567 A1* | 2/2020 | Lesesky | B60C 23/0493 |
| 2020/0120800 A1* | 4/2020 | Pon | H05K 3/284 |
| 2020/0375441 A1* | 12/2020 | Bayer | A61B 1/005 |
| 2020/0405237 A1* | 12/2020 | Trabish | A61B 5/6833 |

FOREIGN PATENT DOCUMENTS

| | | | | |
|---|---|---|---|---|
| CN | 207123341 U | * | 3/2018 | |
| CN | 108031874 A | * | 5/2018 | |
| CN | 212108230 U | * | 12/2020 | |
| CN | 112634598 A | * | 4/2021 | |
| JP | 2007113858 A | * | 5/2007 | |
| WO | WO-2020010195 A1 | * | 1/2020 | ............. G01K 1/024 |

* cited by examiner

Cross Section a-a

MODULAR WIRELESS SENSING DEVICE

The present disclosure relates to a wireless sensing device.

BACKGROUND

Sensing devices and data loggers are used to monitor the environment in enclosed spaces, including packages and vehicles containing sensitive goods during transit. Sensing devices and data loggers are also used to monitor the environment in stationary equipment such as incubators, refrigerators, freezers, and food display cabinets.

Incumbent sensing devices/data loggers typically require hard-wired electrical connection to external equipment for data retrieval. Another drawback of current data logger is the necessity for specialized external equipment in order to communicate with the logger sensor and for retrieving and processing the logger data. As such, conventional self-contained data loggers are large in size.

The art recognizes the need for a compact sensing device that can be deployed as either (i) a sensor to monitor stationary environments or (ii) a self-contained logger to monitor shipments. The art further recognizes the need for a sensing device that is compact and can communicate wirelessly with standard computing devices, such as a smartphone for example.

SUMMARY

The present disclosure provides a wireless sensing device. In an embodiment, the wireless sensing device includes (A) a button cell. The button cell has a positive electrode and a negative electrode. The device includes (B) a first printed circuit board (1PCB) located on a top surface of the button cell. The 1PCB has a first contact and a second contact electrically connected to respective positive electrode and negative electrode of the button cell. The 1PCB includes (i) a processor, and (ii) a wireless communication component (WCC). Each of the (i) processor, and (ii) WCC are electrically connected to the 1PCB. The device includes (C) a sensor module. The sensor module includes a second PCB (2PCB) and one or more sensor chips electrically connected to the 2PCB. (D) The device has a length from 10 mm to 30 mm, a thickness from 3 mm to 10 mm and a width from 10 mm to 30 mm.

An advantage of the present disclosure is a compact wireless sensing device that is capable of communicating with a standard computing device (such as a smartphone) without the need for additional peripheral devices or specialized equipment for data retrieval.

An advantage of the present disclosure is a compact wireless sensing device that has multi-modal functionality—the wireless sensing device capable (i) to as function as a real-time sensor that transmits data automatically or (ii) to function as a central data collection service.

An advantage of the present disclosure is a wireless sensing device with a modular design thereby enabling customization of the sensor module at time of purchase and minimize inventory of completed units.

An advantage of the present disclosure is a process for producing wireless sensing devices whereby a fabricator can customize batch-size production of wireless sensing devices with tailored sensor features meeting customer needs in an economical and efficient manner, with low overhead and low inventory.

An advantage of the present disclosure is a sensing device that is capable of wireless communication and is fabricated with a pre-calibrated sensor chip for the sensor module, such that the wireless sensing device is pre-calibrated when delivered to end user.

DEFINITIONS

Figure 1:
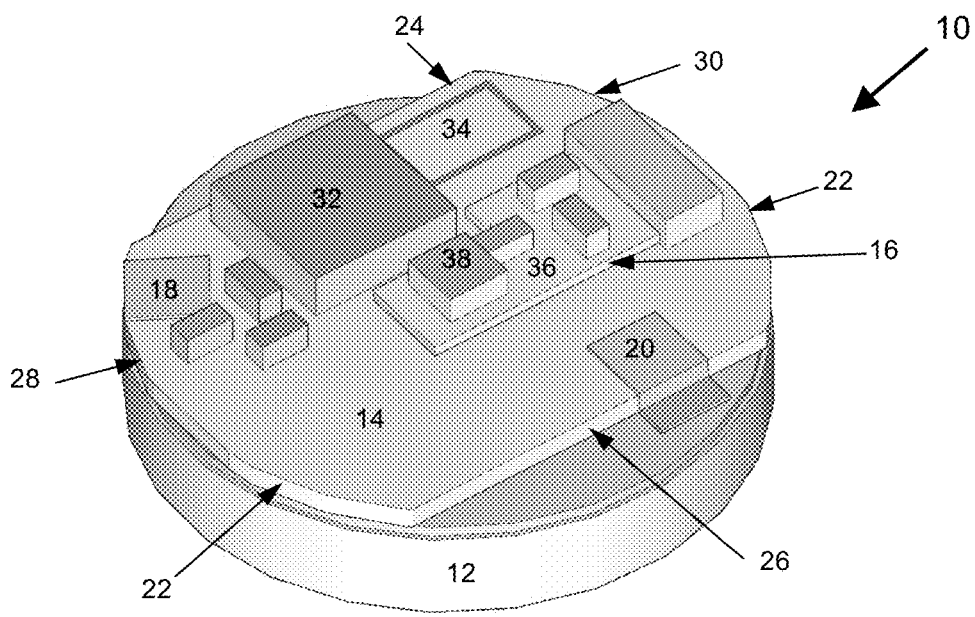
FIG. 1 is a perspective view of a wireless sensing device in accordance with an embodiment of the present disclosure.

The terms "comprising," "including," "having," and their derivatives, are not intended to exclude the presence of any additional element, component, step or procedure, whether or not the same is specifically disclosed. In contrast, the term, "consisting essentially of" excludes from the scope of any succeeding recitation any other element, component, step or procedure, excepting those that are not essential to operability. The term "consisting of" excludes any element, component, step, or procedure not specifically delineated or listed.

A "computing device" (or "a computer readable device") is a non-transitory computing device with a central processing unit (CPU), random access memory (RAM), and a storage medium (such as hard disk drive, solid state drive, flash memory, and/or cloud storage. Nonlimiting examples of computing devices include personal computers (PCs), smart phones, laptops, mobile computing devices, tablet PCs, and servers. The term "computing device" may also describe two or more computing devices communicatively linked in a manner as to distribute and share one or more resources, such as clustered computing devices and server banks/farms. It is understood that any number of computing devices could be used, and embodiments of the present disclosure are contemplated for use with any computing device.

The term "electrical connection" or "electrically connected" is the ability to allow the flow of electrons between two or more components. Electrical connection is the flow of an electrical current between two points.

The "Internet" refers to interconnected (public and/or private) networks that may be linked together by protocols (such as TCP/IP and HTTP) to form a globally accessible distributed network. While the term Internet refers to what is currently known (e.g., a publicly accessible distributed network), it also encompasses variations which may be made in the future, including new protocols or any changes or additions to existing protocols.

A "pad" is a portion of exposed metal on the surface of a printed circuit board to which a component is soldered.

A "plated through hole" is a hole on a printed circuit board which has an annular ring and which is plated all the way through the printed circuit board.

A "printed circuit board" (or "PCB") is a board composed of one or more layers of dielectric or ceramic layers, or a semiconducting substrate that has lines and pads that connect various points together. A printed circuit board includes traces that electrically connect the various connectors and components to each other. A printed circuit board allows signals and power to be routed between physical devices. Solder is the metal that makes the electrical connections between the surface of the PCB and the electronic components. Being metal, solder also serves as a strong mechanical adhesive. PCB includes at least one layer of conductive material and at least one layer of insulative material. It is understood that PCB may have two or more layers of alternating conductive material and insulative material.

A "sensor chip" is an integrated circuit (IC) composed of a semiconductor wafer on which one or more tiny resistors, capacitors, and transistors are fabricated. The sensor chip includes logic that is programmable for sensing a condition such as temperature, moisture, pressure, sound, vibration, motion, acceleration and/or the presence of a chemical. The IC may include semiconductor diodes that have condition-sensitive voltage vs. current characteristics to sense one or more of the aforementioned conditions. The IC may also include logic to function as an amplifier, oscillator, timer, counter, computer memory, or microprocessor. A "digital temperature sensor chip" is a sensor chip with a digital IC—as opposed to an analog IC. The term "digital" refers to electronic technology that generates, stores, and processes data in terms of two states: positive and non-positive. Positive is expressed or represented by the number 1 and non-positive by the number O. Thus, data transmitted or stored with digital technology is expressed as a string of O's and I'S. Each of these state digits is referred to as a bit (and a string of bits that a computer can address individually as a group is a byte). Digital excludes analog technology, which conveys data as electronic signals of varying frequency or amplitude that are added to carrier waves of a given frequency. The digital temperature sensor chip includes logic for sensing temperature.

A "server" is a computer program that provides services to other computer programs (and their users) in the same or other computing devices. The computing device that a server program runs in is also frequently referred to as a server (though it may be used for other purposes as well). Specific to the Web, a Web server is the computer program (housed in a computing device) that serves requested HTML pages or files. A Web client is the requesting program associated with the user. For example, the Web browser in a home PC is a client that requests HTML files from a Web server.

"Surface mount" is a construction method which allows electric components to be simply set on a PCB, not requiring that leads pass through holes in the board.

A "through-hole" is a hole in a PCB used to pass a signal from one layer to another.

A "trace" is a continuous path of a conductive material, typically a metal. A nonlimiting example of a trace is a continuous path of copper on a surface of a PCB.

A "web site" refers to a system that serves content over a network using the protocols of the World Wide Web. A web site may correspond to an Internet domain name, and may serve content associated or provided by an organization. The term may encompass (i) the hardware/software server components that serve objects and/or content over a network, and/or (ii) the "backend" hardware/software components, including any standard, nonstandard or specialized components, that may interact with the server components that provide services for Web site users.

"Wireless communication" is the transmission of information using electromagnetic signals including current wireless technologies such as Near Field Communications (NFC), Wi-Fi, infrared, Bluetooth, Zigbee, LoRa, NFC, IEEE802.15.4, IEEE 802.11, or one or more variants of wireless cellular technology.

The "World Wide Web" (or "Web") refers to (i) a distributed collection of user viewable or accessible documents (that may be referred to as Web documents or Web pages) or objects that may be accessible via a publicly accessible distributed network like the Internet, and/or (ii) the client and server software components which provide user access to documents and objects using communication protocols. A protocol that may be used to locate, deliver, or acquire Web documents or objects through HTTP (or other protocols), and the Web pages may be encoded using HTML, tags, and/or scripts. The terms "Web" and "World Wide Web" encompass other languages and transport protocols including or in addition to HTML and HTTP that may include security features, server-side, and/or client-side scripting.

The numerical ranges disclosed herein include all values from, and including, the lower value and the upper value. For ranges containing explicit values (e.g., 1 or 2, or 3 to 5, or 6, or 7) any subrange between any two explicit values is included (e.g., 1 to 2; 2 to 6; 5 to 7; 3 to 7; 5 to 6; etc.).

DETAILED DESCRIPTION

1. Sensing Device

The present disclosure provides a wireless sensing device. In an embodiment, the wireless sensing device includes (A) a button cell having a positive electrode and a negative electrode. The wireless sensing device includes (B) a first printed circuit board (IPCB) located on a top surface of the button cell the IPCB having a first contact and a second contact electrically connected to respective positive electrode and negative electrode. The IPCB has (i) a processor, and (ii) a wireless communication component (WCC). Each of (i) the processor and (ii) the WCC are electrically connected to the IPCB. The wireless sensing device includes (C) a sensor module. The sensor module includes a second PCB (2PCB) and one or more sensor chips electrically connected to the second PCB. The wireless sensing device has a length from 10 mm to 30 mm, a height from 3 mm to 10 mm and a width from 10 mm to 30 mm.

Figure 2:
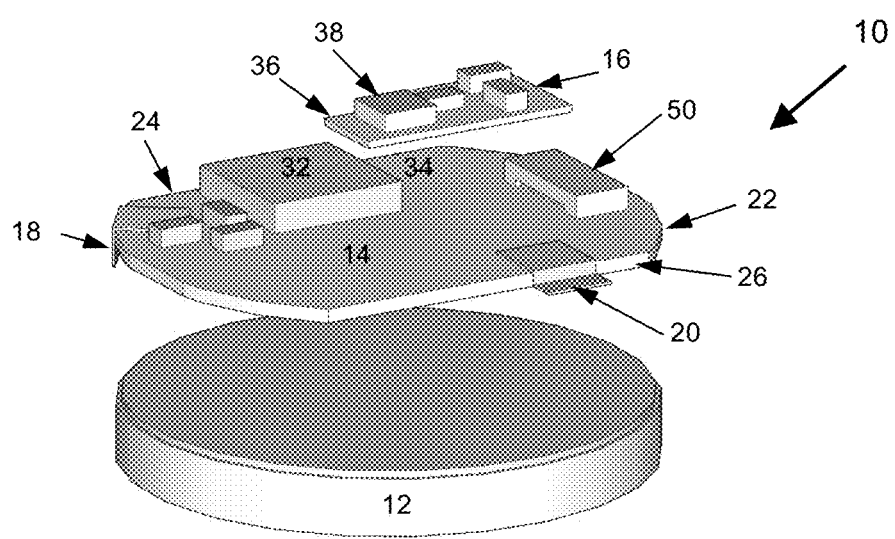
FIG. 2 is an exploded perspective view of the wireless sensing device of FIG. 1.

FIG. 1 and FIG. 2 show an embodiment of a wireless sensing device 10. Wireless sensing device 10 includes a button cell 12, a first printed circuit board 14, and a sensor module 16, the components of each will be described in detail below. A "button cell," as used herein, is a small single cell battery shaped as a squat cylinder typically from 5 millimeter (mm) to 30 mm in diameter and from 1 mm to 8 mm in height and resembles a button on a garment, hence the term "button cell." A metal can forms the bottom body and the positive electrode of the button cell. An insulated top metal cap forms a top surface of the button cell and is also the negative electrode of the button cell.

The button cell provides from 3.0 volts to 3.7 volts. Nonlimiting examples of suitable button cells include lithium manganese dioxide (LiMn02) primary cells (CR type), lithium/carbon monofluoride Li—(CF) primary cells (BR type), and lithium polymer rechargeable cells.

In an embodiment, the button cell is a CR2330 button cell available from Panasonic or Energizer.

FIGS. 1 and 2 show the first printed circuit board 14 (hereafter "IPCB" or "IPCB 14") located on a top surface of the button cell 12. The IPCB 14 has a first contact 18 and a second contact 20. The first contact 18 is electrically connected to the positive electrode (metal can body) of the button cell 12. The second contact 20 is electrically connected to the negative electrode (top cap) of the button cell 12. Nonlimiting examples of suitable electrical connection between the contacts 18, 20 and respective battery electrodes include solder, weld, conductive conduit, and combinations thereof.

In an embodiment, non-conductive barrier is present between the underside of PCB 14 and the top (top cap) of the button cell 12. Non-conductive barrier may be provided by fabricating IPCB such that no conductive material (e.g., no metal) is present on the underside of the IPCB. In other words, the IPCB is fabricated such that no metal traces, and/or no metal contacts, and/or no metal pads, and/or no metal through-holes, and/or no metal vias are present on the underside surface of the IPCB.

In another embodiment, non-conductive barrier between the IPCB underside and the top of the button cell is provided by placing, or otherwise locating, a film of non-conductive material between the underside of the IPCB and the top of the button cell 12. Nonlimiting examples of suitable materials for the non-conductive film include polymeric material, cloth, glass, silicon, cellulosic material (i.e., paper) and any combination thereof.

Figure 3:
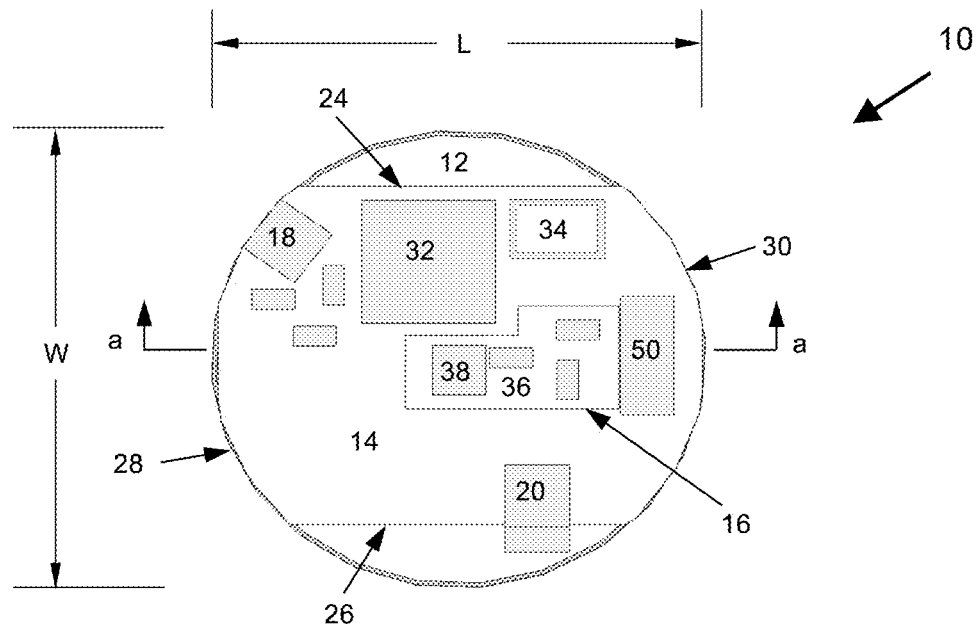
FIG. 3 is a top plan view of the wireless sensing device of FIG. 1.

FIG. 3 shows the IPCB 14 has a peripheral edge 22. The peripheral 22 edge includes a straight portion 24. In other words, a portion of the peripheral edge includes straight portion 24. In an embodiment, the peripheral edge 22 includes opposing straight portions 24 and 26 and opposing arcuate portions 28 and 30. The straight portions 24 and 26 are parallel, or substantially parallel, with respect to each other.

The IPCB 14 includes a processor and a wireless communication component (hereafter "WCC") electrically connected to the IPCB, or otherwise surface mounted onto the IPCB. The WCC has a perimeter that is polygonal in shape (such as a square or rectangle). The WCC is located on the IPCB 14 so that one side of the WCC is adjacent to the straight portion 24. In other words, one side of the WCC is parallel to and coextensive with, or substantially coextensive with, the straight portion 24 of the peripheral edge.

The processor and the WCC may be discrete components. Alternatively, the processor and the WCC may subcomponents of an integrated component.

In an embodiment, the IPCB 14 includes a system-in-package module 32 (or "SiP module") electrically connected to the IPCB, or surface mounted onto the IPCB. A "SiP module," as used herein, is a plurality of integrated circuits enclosed in a single physical package (or module). The SiP module includes a carrier to combine multiple integrated circuit (IC) chips and passive components in a BGA/LGA package form factor. The IC chips are either flip-chipped or wire-bonded onto the carrier like leadframe, laminate or LTCC substrate. Active components include radio transceiver, antenna, processor, flash memory, random access memory (RAM), crypto-accelerator, integrated DC-DC converter, onboard Bluetooth stack, and any combination thereof. Passive components include resistor, capacitor, inductor and filters (SAW/BAW/Balun). The active and passive components are incorporated into the SiP module in the form of discrete devices, integrated devices, and/or embedded devices in the substrate. A protective casing (such as over-mold encapsulation, for example) is included in order to provide physical and mechanical protection and to implement EMI shielding at the module level. In other words, the SiP module 32 includes the WCC and processor in a single component.

In an embodiment, the SiP module 32 has a perimeter shape that is a polygon, such as a square as shown in FIG. 3. FIG. 3 shows one side of the square-shaped SiP module 32 is coextensive with, and parallel to, the straight portion 24.

In an embodiment, the IPCB 14 includes a BGM11S Blue Gecko Bluetooth SiP module available from Silicon Laboratories, Inc.

It is understood that other electrical components may be mounted on the IPCB. The additional components may be or may not be in electrical connection with the SiP module 32. Nonlimiting examples of other electrical components that may be mounted on the IPCB include antenna, application specific integrated circuit (ASIC), capacitor, diode, memory, optoelectronic device, transducer, transistor, switch, resistor, and any combination thereof.

In an embodiment, FIGS. 1-3 show the IPCB 14 includes a ground plane 34. The ground plane 34 is electrically connected to the SiP module 32 and the ground plane 34 is embedded in the IPCB. The ground plane 34 is a multilayer structure and includes a first layer that is a conductive layer (i.e. metal such as copper, for example) and a second layer in contact with the first layer, the second layer composed of a non-conductive material.

The sensor module 16 is electrically connected to the IPCB 14. The sensor module 16 includes a second printed circuit board 36 (or "2PCB"), and one or more sensor chips surface mounted thereon. Nonlimiting examples of suitable sensor chips include a pressure sensor chip, a humidity sensor chip, an optical sensor chip, a temperature sensor chip, an accelerometer sensor chip, and combinations thereof.

In an embodiment, the sensor chip is a digital temperature sensor chip 38 (or DTSC 22) as shown in FIGS. 1-3.

In an embodiment, the DTSC 38 has a temperature range from 55° C. to 150° C. (−58 to 302° F.). A nonlimiting example of a suitable digital temperature sensor chip for DTSC 38 includes the Si7051 digital temperature sensor, available from Silicon Laboratories, Inc.

It is understood that other electrical components may be mounted on the 2PCB. The additional components may be in electrical connection with the sensor chip. Nonlimiting examples of other electrical components that may be mounted on the 2PCB include antenna, application specific integrated circuit (ASIC), capacitor, diode, memory, optoelectronic device, transducer, transistor, switch, resistor, and any combination thereof.

In an embodiment, the sensor module 16 is electrically connected to the IPCB 14 by way of surface mount. FIGS. 1 and 3 show the sensor module 16 surface mounted and electrically connected to the IPCB 14.

Figure 4:
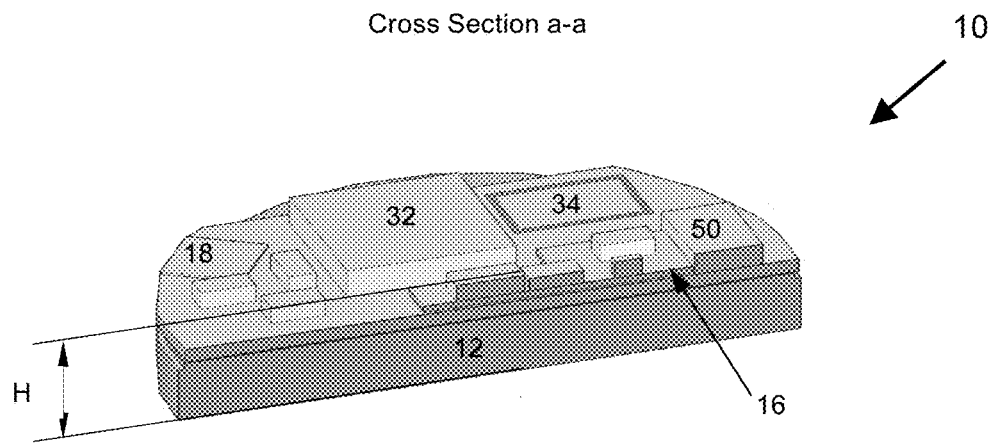
FIG. 4 is a sectional view taken along line 4-4 of FIG. 3.

The present device 10 has a length from 10 mm to 30 mm, a height from 3 mm to 10 mm and a width from 10 mm to 30 mm. As best seen in FIGS. 3-4, the wireless sensing device 10 has a length that is distance L, a height that is distance H, and a width that is distance W. In an embodiment, the wireless sensing device 10 has a length L from 10 mm, or 15 mm, or 20 mm to 25 mm, or 30 mm; a height H from 3 mm, or 4 mm, or 5 mm to 6 mm, or 7 mm, or 8 mm, or 9 mm, or 10 mm; and a width W from 10 mm, or 15 mm, or 20 mm to 25 mm, or 30 mm.

Figure 5:
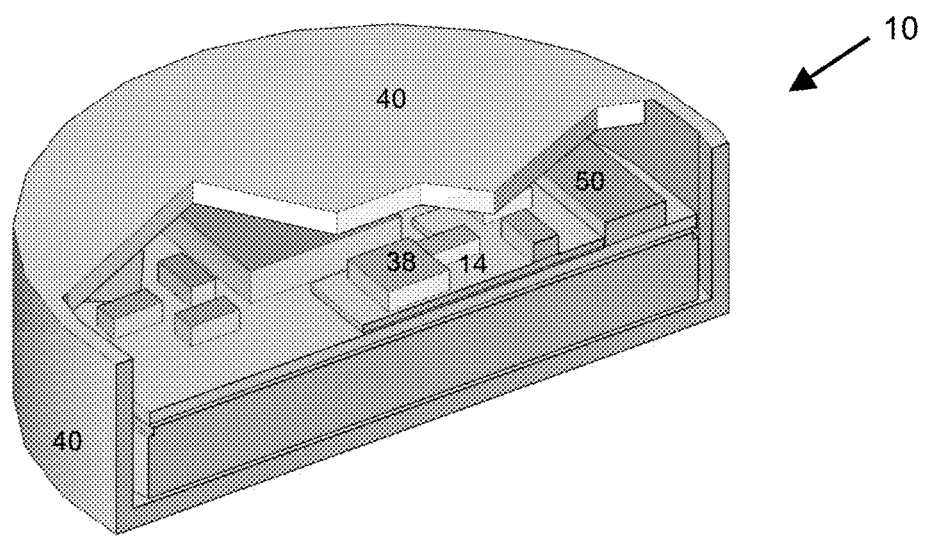
FIG. 5 is a cutaway perspective view of the wireless sensing device in a housing in accordance with an embodiment of the present disclosure.

In an embodiment, device 10 includes a housing. FIG. 5 shows the wireless sensing device enclosed within housing 40. The housing 40 encases the button cell 12, the IPCB 14 and the sensor module 16. The housing 40 provides physical and mechanical protection to the button cell-IPCB-sensor module assembly. The housing 40 may or may not provide a waterproof barrier for the button cell-IPCB-sensor module assembly.

Nonlimiting examples of suitable materials for the housing include polymeric material, rubber (including silicone rubber), metal, wood, glass, and combinations thereof.

In an embodiment, the device 10 includes the button cell—IPCB—sensor module assembly encased in the housing 40. The wireless sensing device 10 (with housing) has a length L from 10 mm, or 15 mm, or 20 mm to 25 mm, or 30 mm; a height H from 3 mm, or 4 mm, or 5 mm to 6 mm, or 7 mm, or 8 mm, or 9 mm, or 10 mm; and a width W from 10 mm, or 15 mm, or 20 mm to 25 mm, or 30 mm.

Figure 6:
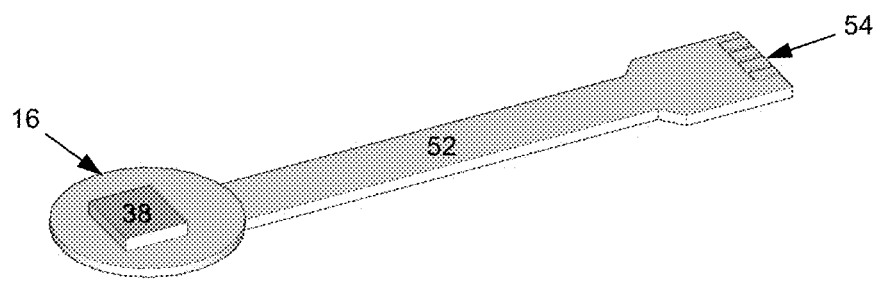
FIG. 6 is a perspective view of a sensor module and ribbon cable in accordance with an embodiment of the present disclosure.
Figure 7:
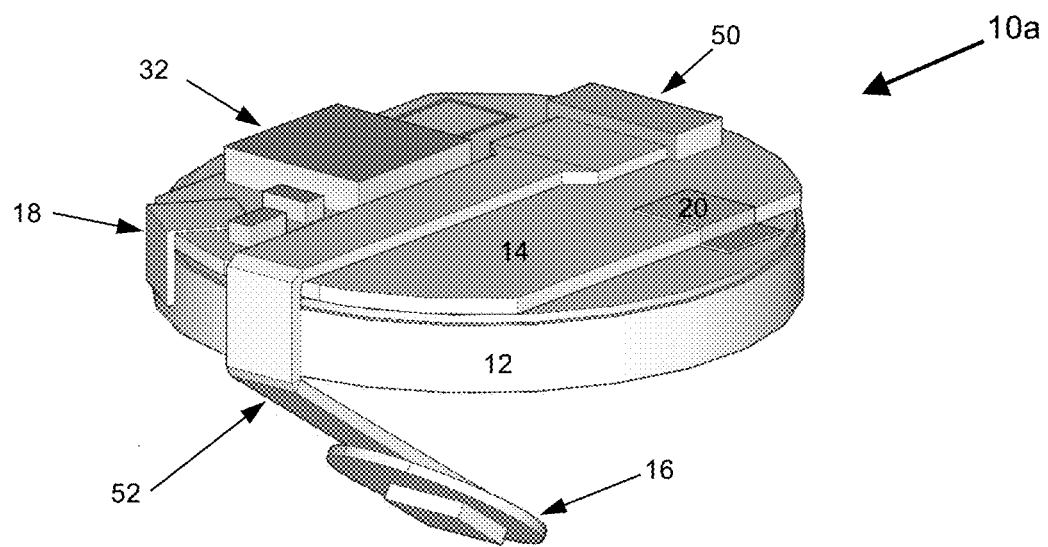
FIG. 7 is a perspective view of the sensor module and ribbon cable attached to a first printed circuit board in accordance with an embodiment of the present disclosure.
Figure 8:
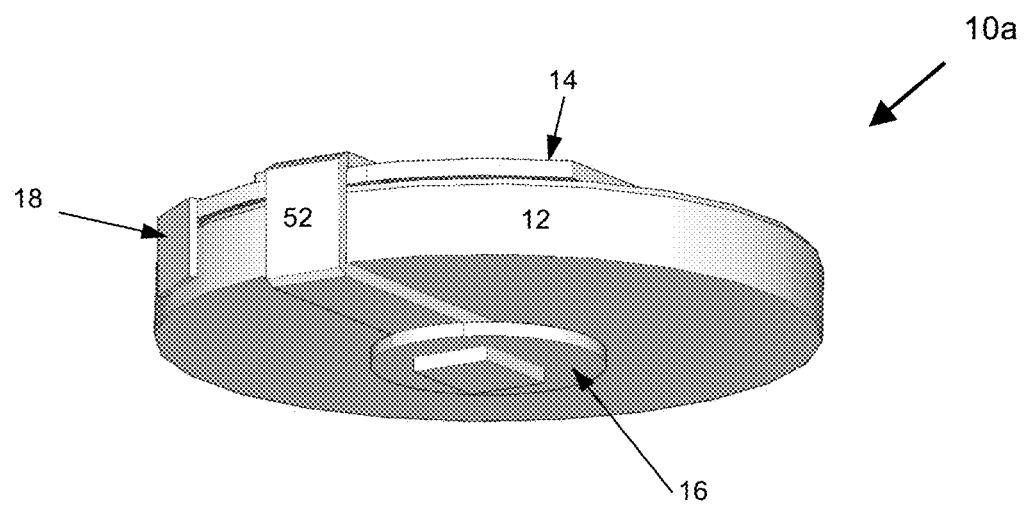
FIG. 8 is a bottom perspective view of the wireless sensing device of FIG. 7 with the sensor module on a bottom side of the button cell in accordance with an embodiment of the present disclosure.

FIGS. 6-8 show an embodiment wherein a female input/output port 50 ("I/O port 50") is surface mounted on and electrically connected to the IPCB 14. The sensor module 16 is electrically connected to one end of a ribbon cable 52. The other end of the ribbon cable includes a male I/O port 54. The male I/O port 54 is connected to the female I/O port 50 on the IPCB as shown in FIG. 7. In this way, the ribbon cable 52 electrically connects the sensor module 16 to the IPCB 14. The "plug-in" feature of the sensor module enables a fabricator to customize the sensor module based on end-user requirements. Once the tailor-made sensor module is produced, the fabricator can simply "plug in" the sensor module 16 into the IPCB yielding a tailor-made sensing device with wireless communication capability.

In an embodiment, FIGS. 7-8 show a wireless sensing device 10a whereby the ribbon cable 52 has a length sufficient such that the sensor module 16 may be located along a bottom side of the button cell 12 while simultaneously maintaining electrical connection between the sensor module 16 and the IPCB. FIG. 7 shows the ribbon cable 52 connected to the IPCB 14 by way of respective I/O ports 54, 50. FIG. 7 further shows the ribbon cable 52 extends along the IPCB 14 and wraps under the button cell 12. FIG. 8 shows the sensor module 16 placed adjacent to the bottom side (or underside) of the button cell 12, the sensor module 16 electrically connected to the IPCB, the IPCB being located on the top side of the button cell. In this way, the wireless device 10a enables the ability to perform sensing activity from the bottom side of the button cell.

Figure 9:
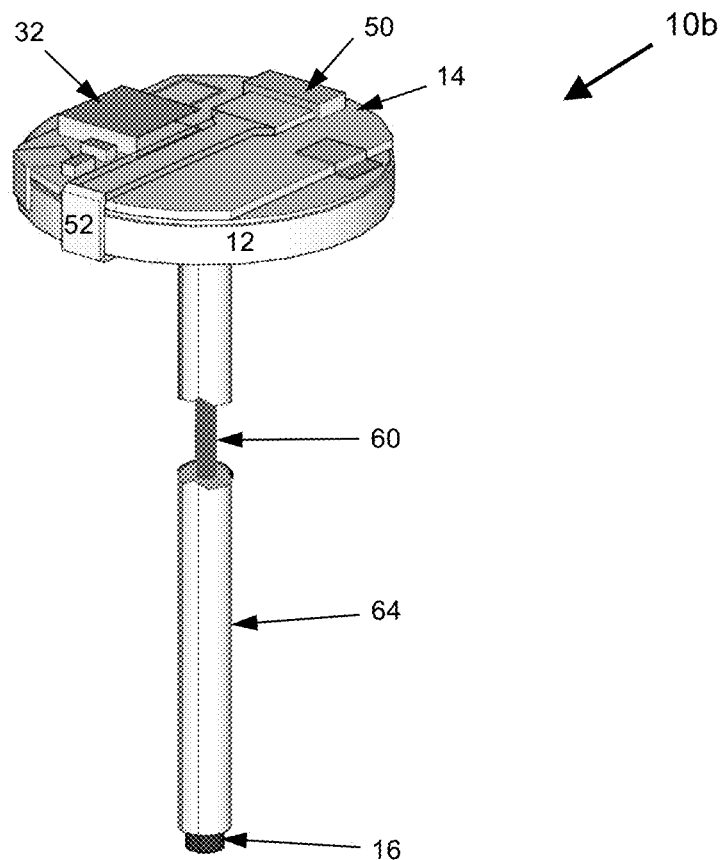
FIG. 9 is a perspective view of a wireless sensing device with a flexible cable in accordance with an embodiment of the present disclosure.

In an embodiment, FIG. 9 shows a wireless sensing device 10b whereby a flexible cable 60 electrically connects the sensor module 16 to the IPCB 14. A proximate end of the flexible cable 60 is electrically connected to the IPCB. Electrical connection between the proximate end of the flexible cable 60 and the IPCB 14 may occur by way of surface mount or plug-in using reciprocal male-female I/O ports as previously discussed. A distal end of the flexible cable is electrically connected to the sensor module 16. The sensor module 16 is encased in a rigid sheath 62. Nonlimiting examples of suitable materials for the rigid sheath 62 include polymeric material, rubber (including silicone rubber), metal, wood, glass, and combinations thereof. In this way, the flexible cable 60 and sheath 62 enable the production of an elongated sensor probe 64. Elongated sensor probe 64 may by a temperature probe, for example.

Figure 10:
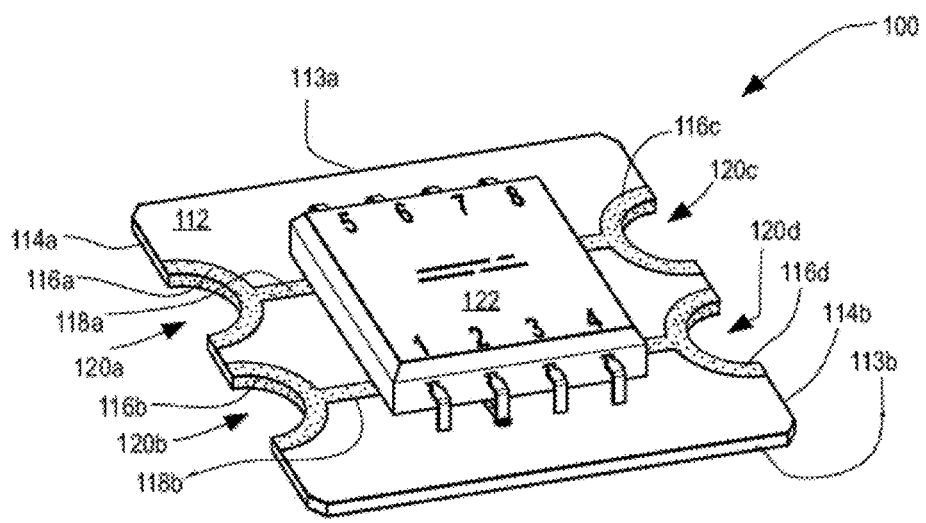
FIG. 10 is a perspective view of a sensor module in accordance with another embodiment of the present disclosure.

In an embodiment, the wireless sensor device 10 includes a sensor module 100. FIG. 10 shows sensor module 100 which includes a second printed circuit board 112. The second printed circuit 112 includes a first side 113a and an opposing second side 113b. The sensor module 100 includes a first edge 114a, and an opposing second edge 114b.

Each edge 114a, 114b includes a pair of through-hole halves (hereafter "THHs"). Edge 114a includes THI-Is 116a, 116b. Edge 114b includes THI-Is lift, 116d.

The second printed circuit board 112 includes a first trace 118a and a second trace 118b. Each trace 118a, 118b traverses the length of the second printed circuit board 112 such that each trace has an exposed end at each edge 114a, 114b. The trace 118a has exposed ends 120a, 120c at respective edges 114a and 114b. The trace 118b has exposed ends 120b, 120d at respective edges 114a and 114b. The exposed ends (120, 120b) of trace 118a do not contact the exposed ends (120c, 120d) of trace 118b.

The sensor module 100 includes a sensor chip 122, such as digital temperature sensor chip (DTSC) 122.

The exposed ends 120a-120d, may or may not include THHs. In the event the panel 112 is fabricated from a substrate that did not include through-holes, the exposed ends 120a120d will not have THHs. Similarly, if the panel 112 is fabricated from a substrate with through holes and singulation splits the through-holes, the exposed ends 120-120d will include THHs 116a-116d.

The exposed ends 120a-120d of the traces 118a, 118b include conductive material. The conductive material extends from the top surface of the second printed circuit board 112 to the bottom surface of the second printed circuit board. The second printed circuit board 122 will have conductive material that extends from the top surface of the second printed circuit board to the bottom surface of the second printed circuit board; the second printed circuit board 122 providing electrical connection between the DTSC 122 and each exposed end 120a-120d.

In an embodiment, the sensor module 100 includes a pre-calibrated sensor chip 122. The sensor chip 122 is pre-calibrated, prior to fabrication of the present wireless sensing device. In a further embodiment, calibration of the sensor chip 112 may be accomplished en masse as disclosed in Applicant's patent application U.S. Ser. No. 15/235,877 filed on Aug. 12, 2016 the contents of which are incorporated by reference herein.

In an embodiment, the present wireless sensing device 10 operatively communicates with a monitor and control system. The monitor and control system may include (i) one or more computing devices, (ii) one or more servers, and (iii) a combination of (i) and (ii). The monitor and control system reads the sensed data (i.e., temperature) and/or other data from the wireless sensing device in real time. The monitor and control system may display an alert real time in the event an "out-of-range" temperature reading is detected. The monitor and control system can also be used to analyze the data, to monitor conditions within an enclosed space (a refrigerated chamber for example) and/or to adjust the temperature within the enclosed space as desired. Communication between the wireless sensing device 10 and the control system may be by way of wireless connection (Bluetooth, the Internet, the Web, or the Cloud).

The present wireless sensing device (10, 10a, 10b) may be configured by a user to function in one of three modes—

Mode 1, Mode 2, or Mode 3. The present wireless sensing device may alternate between the three modes according to configuration by the user at different times.

In Mode 1, the present wireless sensing device functions as a self-contained data logger. In Mode 1, the wireless sensing device records and stores data at regular intervals. As such, it acts as a self-contained recording device that may be used to monitor sensitive products, such as food and/or medications in transit.

Operating in Mode 1, the wireless sensing device is placed in an environment to detect sensed data, such as in a package containing sensitive goods or in a vehicle containing sensitive goods. When the wireless sensing device receives a request for download from a qualified device (such as from a smartphone, for example), the wireless sensing device transmits the stored data via wireless communication. The data is received by a computing device (such as a smartphone for example) and transmitted to a central data collection service. The data is processed and stored by the central data collection service. A server process also scans the data for specific conditions; for example: temperature excursions outside a preconfigured range. The server makes the processed data and any alert messages available via various channels; such as, but not limited to a Web service, email, Internet, SMS etc.

In Mode 2, the present wireless sensing device functions as a beacon sensor. In Mode 2, the present wireless sensing device takes readings via the sensor chip and transmits the data within a beacon signal. The wireless sensing device as beacon sensor transmits (via wireless communication) a message (i.e., sensor data) at regular intervals. A qualified relay device with wireless communication functionality (i.e., Bluetooth functionality), within the range of beacon sensor transmission, receives the readings and transmits the beacon data to a central data collection service (i.e. a cloud based computing device/system or a server-based computing device/system), where the data is processed similar to the logger data.

The beacon function of some wireless protocols (i.e., Bluetooth) is commonly used to locate people or features in an area or provide information such as details of items at sales or galleries.

In Mode 3, the present wireless sensing device functions as hybrid beacon sensor and data logger. In Mode 3, the present wireless sensing device functions as a beacon sensor and also stores a limited number of readings (for example one day of readings) in its internal memory in the same manner as a data logger. If the wireless sensing device is out of range of the relay device, or the relay device fails for a period, once the relay device is restored or in range, the relay device solicits the stored data via wireless communication from the wireless sensing device and uploads the data to a central data collection service (the central data collection service as described above).

In an embodiment, the present wireless sensing device (10, 10a, 10b) includes a) a sensor module which measures the compressive force applied on the convex surface of the device, b) an accelerometer that measures the orientation of the device compared with gravitational force, and c) a temperature sensor (hereafter collectively referred to as "brace data"). The present wireless sensing device is fitted to a custom-made orthopedic brace worn by an patient, typically an adolescent. The readings from the wireless sensing device verify whether the brace is worn correctly by the patient and for the prescribed period each day.

The raw brace data is downloaded from the present wireless sensing device via wireless communication using a smartphone and uploaded to the central data collection service. The raw brace data is processed by the central data collection service to provide the quality and duration of brace wear. The processed brace data is provided to approved users; for example: patient, practitioner, parents and/or guardians, so that any lapses in wear of the brace may be addressed by motivating and encouraging the patient.

The present wireless sensing device advantageously replaces the incumbent system that uses a wired data logger, with data that is downloaded by the practitioner every four months. Under the incumbent system, the patient may lapse in wearing the brace for some months before the practitioner is able to intervene. The present wireless sensing device advantageously provides real-time, or near real-time, brace data for correcting improper brace wear (or for detecting that the brace is not being worn), so that corrective action can be taken immediately thereby improving the treatment protocol for the brace wearer.

Other nonlimiting examples of suitable applications for the present wireless sensing device include: storage and shipping containers, and particularly for sensitive materials such as medicine, genetic material, human organs, biomass (either refrigerated, cryogenic, or unrefrigerated); vehicles; warehouses, dwellings (homes, buildings) where sensors monitor room temperature conditions to determine energy usage; grain storage where sensors monitor conditions to mitigate mildew and insect activity; heat treating kilns; smokehouses and food drying; quality control of food storage, food service, food transport, or food preparation; sensor applications where temperature and humidity are monitored to prevent bacteria and/or spoilage; sensor applications for monitoring curing conditions for plastics and adhesives; autoclaves; and sterilizers.

It is specifically intended that the present disclosure not be limited to the embodiments and illustrations contained herein, but include modified forms of those embodiments including portions of the embodiments and combinations of elements of different embodiments as come within the scope of the following claims

The invention claimed is:
1. A wireless sensing device comprising:
 A. a button cell having a positive electrode and a negative electrode;
 B. a first printed circuit board (1PCB) located on a top surface of the button cell, the 1PCB having a first contact and a second contact electrically connected to respective positive electrode and negative electrode, the 1PCB comprising a system-in-package (SiP) module, where in the SiP module comprises:
  (i) a processor, and
  (ii) a wireless communication component (WCC), each (i) and (ii) electrically connected to the 1PCB;
 C. a ground plane embedded in the 1PCB, the ground plane electrically connected to the SiP module; and
 D. a sensor module comprising a second PCB (2PCB) and one or more sensor chips electrically connected to the 2PCB, wherein
 E. the device has a length from 10 mm to 30 mm, a thickness from 3 mm to 10 mm and a width from 10 mm to 30 mm.

2. The device of claim 1 comprising a non-conductive barrier between an underside of the 1PCB and the top surface of the button cell.

3. The device of claim 2 wherein the non-conductive barrier comprises a film of nonconductive material located between the underside of the 1PCB and the top of the button.

4. The device of claim 1 wherein the sensor module is surface mounted to the top of the 1PCB.

5. The device of claim 1 wherein the 1PCB comprises a first port and the sensor module comprises a second port; and opposing ends of a ribbon cable are connected to the respective first port and the second port and electrically connect the sensor module to the 1PCB.

6. The device of claim 5 wherein the sensor module is located on a bottom side of the button cell.

7. The device of claim 1 wherein the 2PCB comprises a pair of opposing sides and a pair of opposing edges; at least two continuous traces extend along the 2PCB, each trace having opposing ends, each trace end having an exposed area at each edge; and a sensor chip, the sensor chip electrically connected to each trace.

8. The device of claim 1 wherein the sensor module comprises a flexible cable having a proximate end electrically connected to the 1PCB, the flexible cable having a distal end electrically connected to the sensor module and a sensor chip located at a distal end of the flexible cable.

9. The device of claim 1 wherein the sensor element comprises a precalibrated sensor chip.

10. The device of claim 9, further comprising a housing encasing the button cell, the 1PCB, and the sensor module.

11. The device of claim 9 wherein the precalibrated sensor chip is configured to:
  (i) store correction parameters;
  (ii) receive raw data;
  (iii) in response to receiving the raw data, apply correction parameters to the raw data; and
  (iv) generate output data comprising raw data with correction parameters.

12. A wireless sensing device comprising:
  A. a button cell having a positive electrode and a negative electrode;
  B. a first printed circuit board (1PCB) located on a top surface of the button cell, the 1PCB having a first contact and a second contact electrically connected to respective positive electrode and negative electrode, the 1PCB comprising (i) a processor, (ii) a wireless communication component (WCC), and (iii) a first port, wherein each (i) and (ii) electrically connected to the 1PCB;
  C. a sensor module comprising (i) a second PCB (2PCB) (ii) one or more sensor chips electrically connected to the 2PCB, and (iii) a second port wherein opposing ends of a ribbon cable are connected to the respective first port and the second port and electrically connect the sensor module to the 1PCB; and
  D. the device has a length from 10 mm to 30 mm, a thickness from 3 mm to 10 mm and a width from 10 mm to 30 mm.

13. The device of claim 12 wherein the sensor module is located on a bottom side of the button cell.

14. The device of claim 12 wherein the sensor module comprises a flexible cable having a proximate end electrically connected to the 1PCB, the flexible cable having a distal end electrically connected to the sensor module and a sensor chip located at a distal end of the flexible cable.

15. A wireless sensing device comprising:
  A. a button cell having a positive electrode and a negative electrode;
  B. a first printed circuit board (1PCB) located on a top surface of the button cell, the 1PCB having a first contact and a second contact electrically connected to respective positive electrode and negative electrode, the 1PCB comprising (i) a processor, and (ii) a wireless communication component (WCC), each (i) and (ii) electrically connected to the 1PCB;
  C. a sensor module comprising a second PCB (2PCB) and one or more sensor chips electrically connected to the 2PCB, wherein the 2PCB comprises a pair of opposing sides and a pair of opposing edges; at least two continuous traces extend along the 2PCB, each trace having opposing ends, each trace end having an exposed area at each edge; and a sensor chip, the sensor chip electrically connected to each trace; and
  D. the device has a length from 10 mm to 30 mm, a thickness from 3 mm to 10 mm and a width from 10 mm to 30 mm.

* * * * *